United States Patent [19]

Choi et al.

[11] Patent Number: 5,607,865
[45] Date of Patent: Mar. 4, 1997

[54] STRUCTURE AND FABRICATION METHOD FOR A THIN FILM TRANSISTOR

[75] Inventors: Jong M. Choi, Seoul; Jong K. Kim, Chungcheongbuk-do, both of Rep. of Korea

[73] Assignee: Goldstar Electron Co., Ltd., Rep. of Korea

[21] Appl. No.: 381,425

[22] Filed: Jan. 27, 1995

[51] Int. Cl.⁶ .......................... H01L 29/06; H01L 21/265
[52] U.S. Cl. .............................. 437/21; 437/41; 437/62; 257/63; 257/307
[58] Field of Search .................... 257/307, 63, 347; 437/40, 41 DM, 61, 62, 909, 917, 21, 41 TFI

[56] References Cited

U.S. PATENT DOCUMENTS 5,065,210  11/1991  Hirakawa ............................ 257/307
5,115,289   5/1992  Hisamoto et al. ................... 257/347
5,391,506   2/1995  Tada et al. ........................... 437/41
5,459,344  10/1995  Wakamiya et al. ................. 257/307

*Primary Examiner*—Donald L. Monin, Jr.
*Attorney, Agent, or Firm*—Faegre & Benson LLP

[57] ABSTRACT

A structure and fabrication method for a thin film transistor which is suitable for an SRAM memory cell. The thin film transistor structure includes an insulating substrate and a semiconductor layer formed as a wall on the insulation substrate. A gate insulation film is formed on the semiconductor layer and over the entire surface of the insulation substrate. A gate electrode formed on the gate insulation film at the center part of the semiconductor layer. Impurity regions are formed in the semiconductor layer on both sides of the gate electrode.

8 Claims, 4 Drawing Sheets

STRUCTURE AND FABRICATION METHOD FOR A THIN FILM TRANSISTOR

FIELD OF THE INVENTION

This invention relates generally to thin film transistors. In particular, the present invention is a structure and fabrication method for a thin film transistor which can be used in an SRAM memory cell.

BACKGROUND OF THE INVENTION

Thin film transistors ("TFTs") are often used in place of load resistors in SRAMs of the type over the 1M class. TFTs are also widely used in liquid crystal displays as switching elements for switching video data signals of the pixel regions.

In a high quality SRAM, a thin film transistor has a reduced and relatively low off current and an increased and relatively high on current. SRAMs with TFTs having these characteristics have reduced power consumption and improved memory capabilities. Based on the foregoing principle, studies for improving the on/off current ratio are actively underway.

A conventional method for improving the on/off current ratio can be described with reference to FIGS. 1(a)–1(d). Illustrated in FIGS. 1(a)–1(d) are sections of a conventional fabricating process for a thin film transistor. This process uses a bottom gate as a nucleus and results in the growth of larger grain sizes based on solid state grain growth of the silicon body. The grain is grown by heat treatment at about 600 deg. C. for a relatively long period of time, such as 24 hours.

As shown in FIG. 1(a), a gate electrode 2 is formed by depositing polysilicon on an insulating substrate 1 or on an insulating film, and patterning the polysilicon with a photoetching process using a gate mask. Then, as shown in FIG. 1(b), a layer of gate insulation film 3 and a body of polysilicon 4 are deposited successively over the surface of the gate electrode 2 and the substrate 1 using a chemical vapor deposition method. Thereafter, the grain size of the polysilicon body is grown larger using the solid state grain growth method by heat treating the polysilicon body at about 600 deg. C. for a relatively long time, such as about 24 hours.

As shown in FIG. 1(c), the channel region is masked by depositing a photosensitive film 5 on the body of polysilicon 4 and carrying out exposure and development processes. The channel region is masked and formed so that the source region 6a overlaps the gate electrode 2, and the drain region 6b is offset with respect to the gate electrode 2. Then, as shown in FIG. 1(d), by injecting P-type impurity ions e.g., (BF$_2$), into the exposed body of polysilicon 4, and forming source/drain regions 6a and 6b, a conventional P-type MOS thin film transistor can be completed. The various regions of the transistor shown in FIG. 1(d) are indicated by the following relation: a: source region, b: channel region, c: drain region.

However, the conventional thin film transistor described above has a number of deficiencies. First, the definition of the channel region together with the offset region using the photomask process complicates the process, makes reproduction difficult and greatly increases variation of the off current depending on degree of the alignment. The reliability of the thin film transistor is thereby degraded.

Second, since the position of the channel is relatively far from the gate electrode, the channel may not be completely cut off or inverted. Leakage current can therefore occur, reducing the on current.

Third, because the channel of the thin film transistor has a planar arrangement, if the cell size becomes smaller, the length of the channel also becomes shorter. This shorter channel results in increased leakage current, and thereby limits the level of integration that can be obtained.

SUMMARY OF THE INVENTION

An object of this invention is to solve the foregoing problems and provide a thin film transistor which can be made by a simplified process and incorporated into an SRAM memory element, while reducing the off current and increasing the on current.

These and other objects and features of this invention can be achieved by providing a thin film transistor structure including an insulating substrate with a semiconductor layer formed as a wall on the insulating substrate. A gate insulation film is formed on the semiconductor layer and on all of the surface of the insulating substrate. A gate electrode is formed on the gate insulation film at a center part of the semiconductor layer. Impurity regions formed in the semiconductor layer on both sides of the gate electrode.

A method for fabricating a thin film transistor includes forming a semiconductor layer having the shape of a wall on an insulating substrate, and forming a gate insulation film all over the surface of the insulating substrate and the semiconductor layer formed thereon. A gate electrode is formed on the gate insulation film over the center part of the semiconductor layer. Impurity regions are formed in the semiconductor layer on both sides of the gate electrode.

DETAILED DESCRIPTION OF THE INVENTION

Figure 1A:
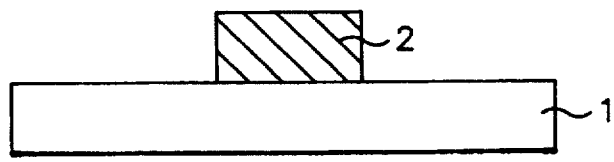
FIGS. 1(a)–1(d) are sectional views showing a conventional process for fabricating a thin film transistor.
Figure 1B:
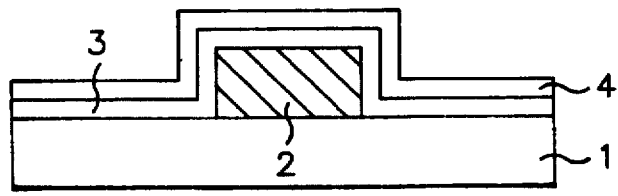
Figure 1C:
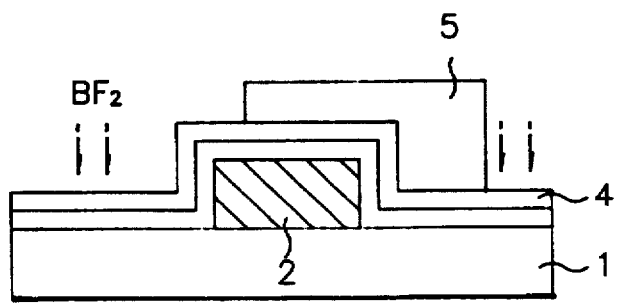
Figure 1D:
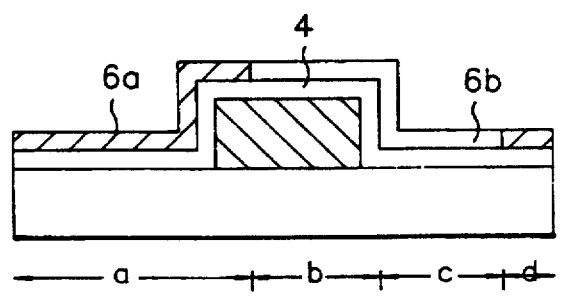
Figure 2:
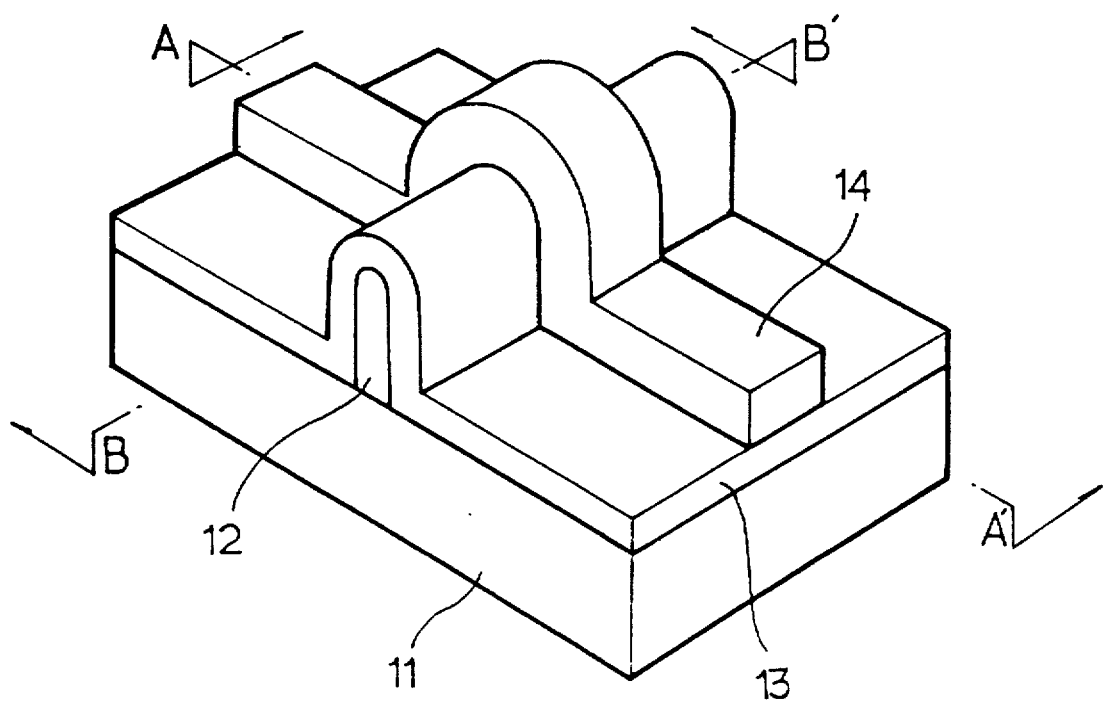
FIG. 2 is a perspective view of a thin film transistor in accordance with this invention.
Figure 4:
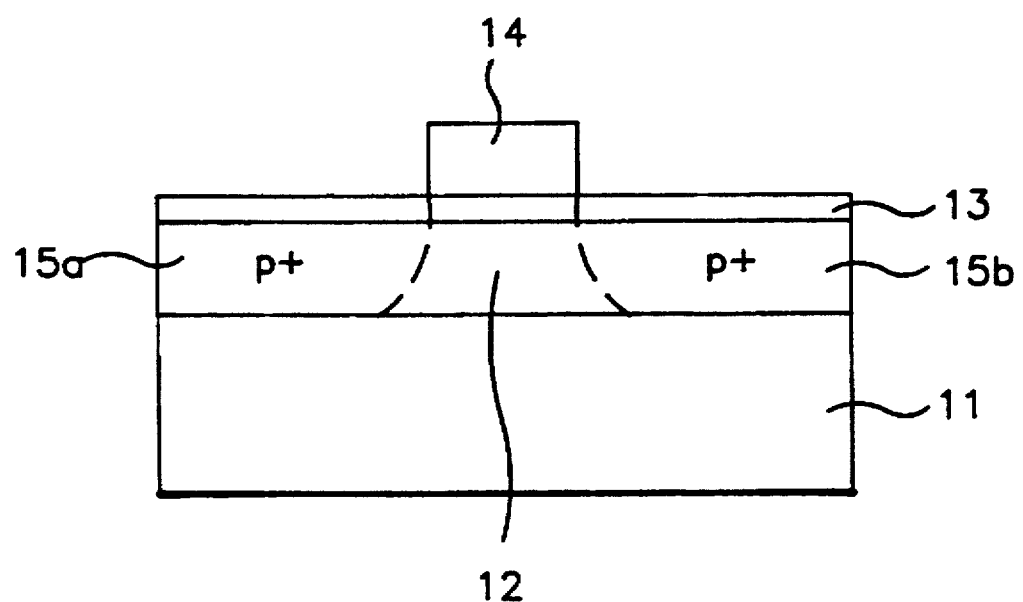
FIG. 4 is a sectional view across line B-B' of FIG. 2.

As shown in FIGS. 2 and 4, a thin film transistor structure in accordance with this invention includes a semiconductor layer 12 formed as a wall on an insulating substrate 11 for use as an active layer. A gate insulation film 13 is formed on the semiconductor layer 12 and over the entire surface of the insulating substrate 11. A gate electrode 14 is formed on the gate insulation film 13 at the center part of the semiconductor layer 12. Impurity regions 15a and 15b for source and drain regions, respectively, are formed in the semiconductor layer 12 on opposite sides of the gate electrode 14.

Figure 3A:
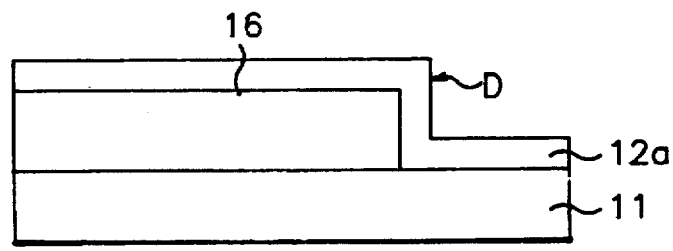
FIGS. 3(a)–3(d) are sectional views across line A-A' of FIG. 2, showing a process for fabricating a thin film transistor in accordance with this invention.

A method for fabricating the thin film transistor shown in FIGS. 2 and 4 can be described with reference to FIGS. 3(a)–3(d). As shown in FIG. 3(a), an insulating film 16 (such as a nitride film) is deposited on an insulating substrate 11. The insulation film 16 is removed using photoetching technology so that the insulation film remains on one side of substrate 11, centered on a part which will be an active region of the transistor. A semiconductor layer 12a (such as a polysilicon layer) is deposited over the entire surface of insulation film 16 and substrate 11. Insulation film 16 is then subjected to a patterning process such as that described above to form an active region at the side wall of the insulation film 16. The thickness of the insulation film 16 affects the height of the active region.

Figure 3B:
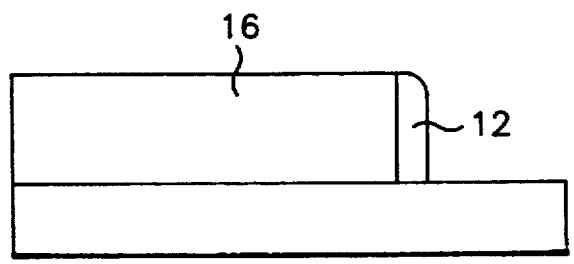

As shown in FIG. 3(b), the active region is then patterned by subjecting the semiconductor layer 12a to an anisotropic etching process to form a side wall semiconductor layer 12. Semiconductor layer 12 is thereby formed so as to position a channel in a direction of the wall surface of the side wall of the insulation film 16.

Figure 3C:
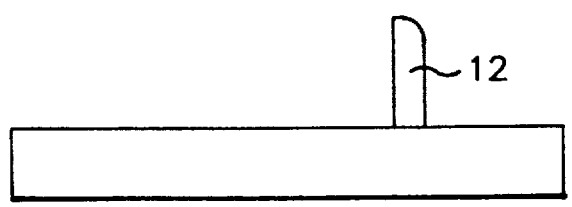

As shown in FIG. 3(c), the insulation film 16 is then completely removed using a wet etching process (e.g., with $H_3PO_4$ in the embodiment described herein where a nitride film has been deposited as the insulation film).

Figure 3D:
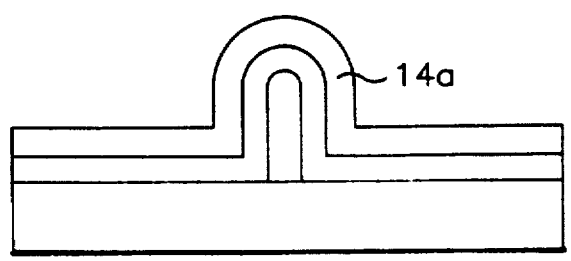

As shown in FIG. 3(d), a gate insulation film 13 (e.g., silicon oxide film) is deposited over the entire surface of the insulation substrate 11 and the semiconductor layer 12 formed thereon. Conductive material 14a such as doped polysilicon is deposited on the gate insulation film 13. The gate insulation film 13 is formed so as to enclose the wall shaped semiconductor layer 12.

As shown in FIGS. 2 and 4, gate electrode 14 is formed by selectively removing the conductive material 14a using a gate electrode pattern mask. In the embodiment shown, the gate electrode 14 is formed so that the gate electrode is positioned on the center of the semiconductor layer 12 in a perpendicular relationship to the longitudinal direction of layer 12.

Impurity regions 15a and 15b for source and drain regions are then formed by injecting impurity ions($P_+$) into the semiconductor layer 12 on both opposite sides of the gate electrode 14 using the gate electrode 14 as a mask.

The thin film transistor structure and fabrication method in accordance with this invention has following advantages. First, since the active region of the semiconductor layer 12 is formed in the shape of a wall and the gate electrode 14 is formed on both sides of the wall, the electric field is uniformly distributed over the channel. The off current $I_{off}$ is thereby reduced and the on current $I_{on}$ increased, thereby improving the characteristics of an SRAM memory. Second, since the active region of the semiconductor layer is formed utilizing side wall of the insulation film, and the source/drain regions are also formed in self alignment utilizing the gate electrode as a mask, the number of masking processes required to fabricate the transistor is reduced from that of the prior art. The transistor can therefore be efficiently fabricated.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

What is claimed is:

1. A method for fabricating a thin film transistor comprising the steps of:

forming a semiconductor layer having a shape of a wall on an insulating substrate, including the steps of:

depositing an insulation film having a thickness equal to a desired height of the wall on the insulating substrate;

removing portions of the insulation film so as to leave the insulation film on one side of the substrate and centered on a part which will be an active region of a transistor;

forming a semiconductor layer in the shape of a wall at the side wall of the insulation film by anisotropic etching of the semiconductor layer; and removing the insulation film;

forming a gate insulation film on the surface of the insulating substrate and the semiconductor layer formed thereon;

forming a gate electrode on the gate insulation film over a center part of the semiconductor layer; and, forming impurity regions in the semiconductor layer on both sides of the gate electrode.

2. The method as claimed in claim 1, wherein the insulation film is formed of a nitride film, and is removed with $H_3PO_4$.

3. The method as claimed in claim 1, wherein the semiconductor layer includes a polysilicon layer.

4. The method as claimed in claim 1, wherein the gate insulation film includes a silicon oxide film.

5. The method as claimed in claim 1, wherein the step of forming the gate electrode further comprises the steps of:

depositing a conductive layer on the gate insulation film; and selectively removing the conductive layer to form the gate electrode.

6. The method as claimed in claim 5, wherein the gate electrode is positioned on the center of the semiconductor layer in a perpendicular relationship to a longitudinal direction thereof.

7. The method as claimed in claim 1 wherein the conductive layer includes a doped polysilicon layer.

8. The method as claimed in claim 1, wherein the step of forming the impurity regions further comprises the step of injecting impurity ions into the semiconductor layer on both opposite sides of the gate electrode using the electrode as a mask.

* * * * *